(12) United States Patent
Yoneda et al.

(10) Patent No.: US 7,589,356 B2
(45) Date of Patent: Sep. 15, 2009

(54) LED AND ATTACHMENT STRUCTURE OF LED

(75) Inventors: Kenji Yoneda, Kyoto (JP); Shigeki Masumura, Kyoto (JP); Hideaki Kashihara, Kyoto (JP)

(73) Assignee: CCS Inc., Kyoto-shi (JP)

( * ) Notice: Subject to any disclaimer, the term of this patent is extended or adjusted under 35 U.S.C. 154(b) by 20 days.

(21) Appl. No.: 10/587,363

(22) PCT Filed: Dec. 22, 2004

(86) PCT No.: PCT/JP2004/019213

§ 371 (c)(1),
(2), (4) Date: Jul. 27, 2006

(87) PCT Pub. No.: WO2005/074044

PCT Pub. Date: Aug. 11, 2005

(65) Prior Publication Data

US 2007/0158671 A1    Jul. 12, 2007

(30) Foreign Application Priority Data

Jan. 30, 2004   (JP) .............................. 2004-022755

(51) Int. Cl.
*H01L 33/00*   (2006.01)
(52) U.S. Cl. .................. 257/99; 257/712; 257/E33.075
(58) Field of Classification Search ............ 257/79, 257/80, 81, 82, 98, 99, 100, 712–722, E33.055–E33.066, 257/E33.075
See application file for complete search history.

(56) References Cited

U.S. PATENT DOCUMENTS 5,077,633 A * 12/1991 Freyman et al. ............ 361/771
6,054,716 A * 4/2000 Sonobe et al. ............ 250/552
6,337,536 B1 * 1/2002 Matsubara et al. .......... 313/498
2003/0038290 A1 * 2/2003 Aizawa et al. ............... 257/80

FOREIGN PATENT DOCUMENTS

| JP | 4-59168 U | 5/1992 |
| JP | 10-21729 A | 1/1998 |
| JP | 2000-312033 A | 11/2000 |
| JP | 2001-44517 A | 2/2001 |
| JP | 2001-77427 A | 3/2001 |
| JP | 2002-252372 A | 9/2002 |
| JP | 2002-359403 A | 12/2002 |
| JP | 2003-188418 A * | 7/2003 |
| JP | 2003-188418 A | 7/2003 |

OTHER PUBLICATIONS

International Search Report mailed Apr. 12, 2005 of International Application PCT/JP2004/019213.

*Primary Examiner*—Sue Purvis
*Assistant Examiner*—Kevin Quinto
(74) *Attorney, Agent, or Firm*—Westerman, Hattori, Daniels & Adrian, LLP

* cited by examiner

(57) ABSTRACT

An LED that can effectively prevent heat accumulation while preventing short-circuiting, discharge, fire and the like, even in the case where LEDs are relatively densely placed, is provided.

In a can type LED 3 where an anode A, a cathode K and an LED pedestal 31*p* are provided within a housing 31, and pins a1 and k1 of anode A and cathode K lead out at least to the outside of housing 31 so that a voltage can be applied between anode A and cathode K via these pins a1 and k1, a condition of isolation is maintained between pin a1 of anode A and housing 31, as well as between pin k1 of cathode K and housing 31, and pin r1 which is thermally connected to LED pedestal 31*p* is provided outside of housing 31.

7 Claims, 12 Drawing Sheets

Fig. 14

LED AND ATTACHMENT STRUCTURE OF LED

BACKGROUND OF THE INVENTION

1. Field of the Invention

The present invention relates to an LED and an attachment structure of an LED which prevent heat accumulation safely and effectively, which can clamp the voltage of the surface of a can, and which allow electrically safe mounting.

2. Description of the Related Art

LEDs have a variety of applications as light emitting elements. Though there are several types of LEDs, such as a resin mold type and a can type, an ultraviolet LED, for example, is greatly deteriorated by ultraviolet light, and emits a large amount of heat, while output is lowered as the quality of resin changes in a resin mold type, and therefore, types that are reliable for a long period of time are limited to the can type. This can type is provided with an LED pedestal surrounded by an anode, a cathode and a reflector within a housing, where at least the connection ends of the anode and the cathode are led out of the housing, in a manner where a voltage is applied between the anode and the cathode via these connection ends, for light emission from the interface between the PN layers of the LED element placed within the housing. This light is reflected from the reflector so as to be guided to a transparent portion made of glass which is attached to the housing, in the configuration of the can type LED. The housing is generally made of a metal.

In such a can type, it is difficult to avoid deterioration in the light emitting property caused by the heat transmission and heat accumulation accompanying light emission, as well as negative effects on durability and longevity caused by heat stress. According to the prior art, however, no examples are cited where a heat radiation structure is actively adopted.

Figure 14:
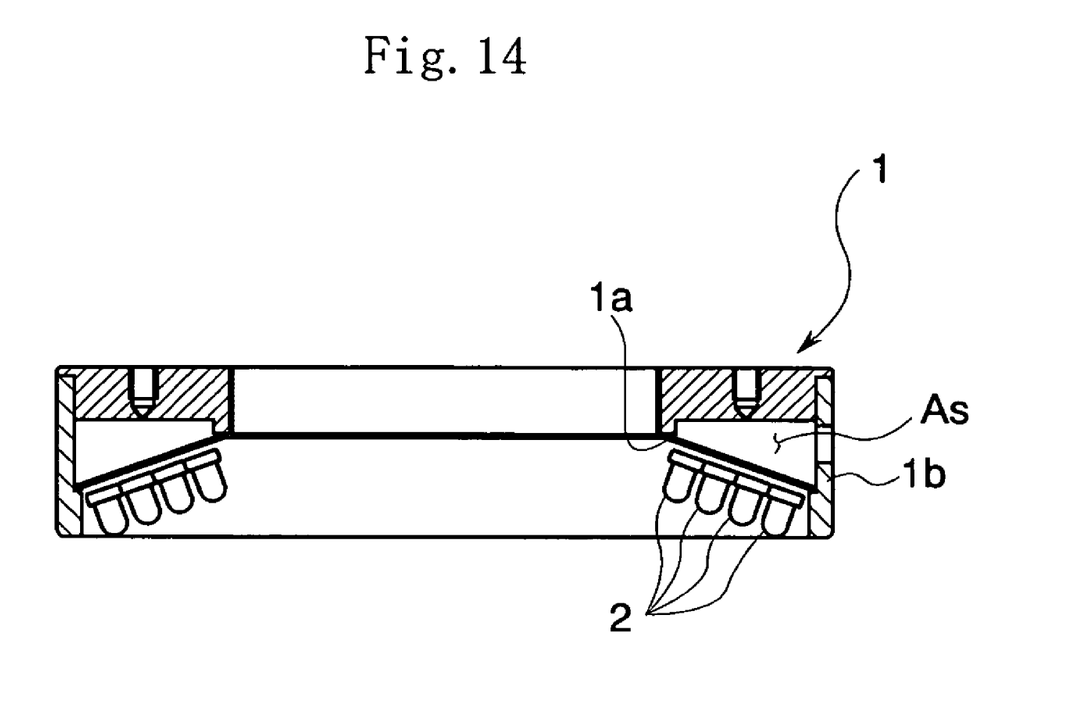
FIG. 14 is a cross-sectional view schematically showing a ring type illumination device to which LEDs are attached.

FIG. 14 illustrates an illumination device 1 for product inspection which is appropriate for use in the case, for example, where products are inspected using reflected illumination. This illumination device 1 is formed of a surface 1a for mounting light emitting bodies in a curved concave form, such as the inner surface of a cylinder or the concave surface of a cone, and of a great number of LEDs 2, which are densely mounted on this surface 1a for mounting light emitting bodies without intervening space.

However, it has conventionally been thought that it is difficult to provide a heat radiation structure on the rear surface of surface 1a for mounting light emitting bodies which curves in this illumination device 1. Therefore, no specific heat radiation member is provided behind LEDs 2 but providing an air layer AS that intervenes between LEDs 2 and a frame member 1b, which merely allows natural heat radiation toward this air layer AS (Japanese Unexamined Patent Publication No. 10-21729).

Figure 11:
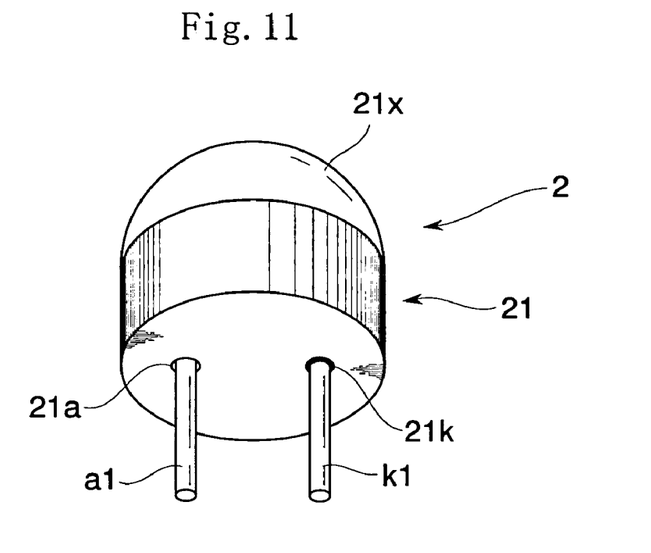
FIG. 11 is a view conceptually showing the appearance of an LED conventionally used.
Figure 12:
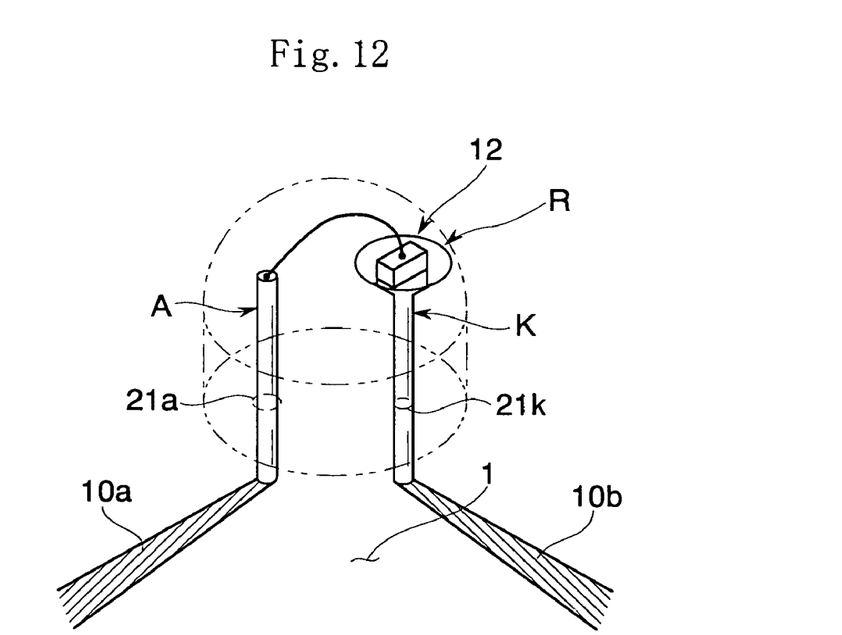
FIG. 12 is a perspective view conceptually showing a conventional heat radiating structure, together with the internal structure of the LED conventionally used.
Figure 13:
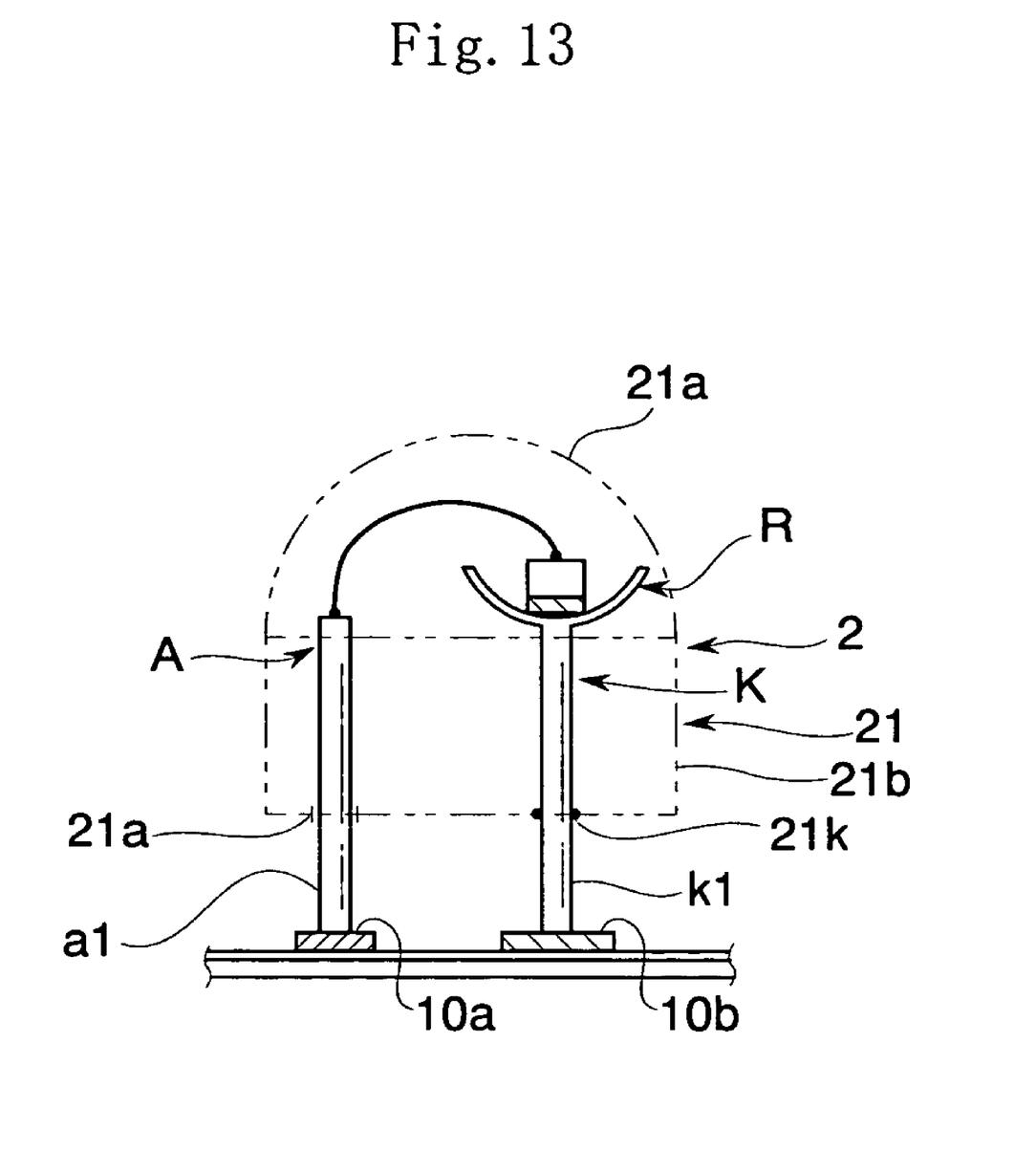
FIG. 13 is a front view of the LED conventionally used.

Therefore, a structure that makes active heat radiation possible has been examined, wherein, as shown in FIGS. 11 to 13, a housing 21 placed beneath a transparent portion 21x which forms an LED2 is formed of a material having a high thermal conductance, and one of connection ends a1 and k1 of an anode A and a cathode K is made to make metallic contact with housing 21 in one of lead positions 21a and 21k (21k in the figure) provided in housing 21, so that heat can be radiated to the air from housing 21. Though in this example, a reflector R conceptually works as the above described cathode K which conducts to a body 21b of the housing, reflector R may be formed in housing 21 by means of digging in a manner where the structure allows cathode K to be mounted in a mounting hole provided in body 21b of the housing. In this case also, reflector R, housing 21 and cathode K are in a condition where they are mutually conductive. In the figures, symbols 10a and 10b indicate wiring patterns. The same effects as in such a structure can be gained in the case where the anode A side is made to conduct to reflector R and housing 21.

SUMMARY OF THE INVENTION

In the case where an LED having such a heat radiation structure is adopted, however, housing 21 is charged with either the polarity of anode A or that of cathode K, and therefore, short-circuiting or discharge occurs between housing 21, connection ends a1, k1 and the like of adjacent LEDs 2, causing a fire in some cases, becoming a large factor for reducing the reliability, durability and safety of the apparatus in the case where LEDs 2 are densely placed to form illumination device 1.

Accordingly, a new LED having an internal structure which can highly efficiently prevent heat accumulation, and which can effectively avoid the occurrence of short-circuiting and discharge between LEDs, as well as fire, even in the case where LEDs are densely placed, and an attachment structure of an LED are desired.

In order to achieve this object, the present invention provides the following means.

An LED of the present invention is a can type LED provided with an anode, a cathode and an LED pedestal within a housing in a manner where at least the connection ends of the anode and the cathode are led out to the outside of the housing for a voltage applied between the anode and the cathode via these connection ends, characterized in that the insulating condition is maintained both between the connection end of the above anode and the housing, as well as between the connection end of the above described cathode and the housing, and in that a lead end that is thermally connected to the above described LED pedestal is provided outside of the housing.

Here, the LED pedestal includes a type in a condition where the LED pedestal is surrounded by the reflector.

In such a manner, heat in the LED pedestal, which is the main heat accumulating portion, can effectively be let out to the outside of the housing via a connection end. In addition, an external configuration where heat is further released to an appropriate portion from the connection end can also be applied, and therefore, it becomes possible to secure a sufficient heat radiation area by selecting a portion of which the space is not easily restricted as a heat radiation portion.

In addition, the housing is electrically disconnected from both the anode and the cathode, and therefore, it becomes possible to effectively avoid the occurrence of a potential difference between a housing and a connection end of adjacent LEDs which becomes the cause of short-circuiting and discharge, even in the case where LEDs are placed relatively densely.

It is desirable to make an electrical connection between the housing and the lead end of the LED pedestal of which the voltage is clamped to the ground or the like, in order to prevent the potential of the housing from becoming unstable.

It is effective to form at least a portion of the housing, in addition to the lead end of the LED pedestal, of an insulating material, in contrast with the formation of the connection ends of the anode and the cathode of a conductive material, in order to make it possible for a metal to make contact with the housing so as to directly draw out heat.

It is preferable for the lead position of the lead end to be set directly beneath the LED pedestal, or to be set in a portion which is approximately in line with the center of the transparent portion that is attached to the housing, together with the LED pedestal, in order to effectively draw out heat from the LED pedestal.

It is effective to align the lead position of the lead end in line with the lead positions of the respective connection ends of the anode and the cathode, in order to provide a flexible connection to an object of which the form is unknown.

It is appropriate to place an LED element on the LED pedestal in an electrically insulated condition, in order to gain the effects of the present invention.

It is preferable to connect a diode between the anode and the cathode in an anti-parallel manner within the housing, in order to effectively protect the LED from static electricity and surge voltage. It is especially desirable for this diode to be a Zener diode.

In this case, it is desirable to use an insulating plate of which the surface is processed with a metal for a Zener diode pedestal in the configuration where the Zener diode is installed within the housing via the Zener diode pedestal in order to make the Zener diode function appropriately.

As for a preferable attachment structure of an LED having an anode, a cathode and an LED pedestal within a housing in the case where the anode and the cathode are connected to wiring patterns provided on a substrate, a structure having a lead end which is thermally connected to the above described LED pedestal outside of the above described LED, where a heat radiation pattern or a cooling pattern is provided independently of the wiring patterns on the above described substrate and the lead end of the above described LED is thermally connected to this heat radiation pattern or cooling pattern can be cited. Here, the cooling pattern indicates a heat radiation pattern, a portion of which a cooling source for actively cooling the system is connected to.

It is desirable for the above described lead end of the LED that has been mounted on the substrate to be electrically connected to the heat radiation pattern or the cooling pattern of the above described substrate, in order to prevent the potential of the lead end of the LED from becoming unstable.

In this case, it is desirable to form the heat radiation pattern or the cooling pattern on the rear surface of the substrate on which the wiring patterns are formed, in order to appropriately provide both the wiring patterns and the heat radiation pattern or the cooling pattern for effective heat radiation.

Alternatively, as for another preferable attachment structure of an LED having an anode, a cathode and an LED pedestal within a housing in the case where the above described anode and cathode are connected to wiring patterns provided to the substrate, a structure having a lead end which is thermally connected to the above described LED pedestal outside of the housing of the above described LED, where a heat radiation member or a cooling member is directly attached to the rear surface of the above described substrate and the lead end of the above described LED is thermally connected directly to this heat radiation member or the cooling member, or thermally connected indirectly to this heat radiation member or the cooling member via a heat radiation pattern or a cooling pattern provided independently of the above described wiring patterns is cited. Here, the cooling member indicates a heat radiation member, a portion of which a cooling source for actively cooling the system is connected to.

In order to enhance the heat radiation effect, it is effective to make the width of the heat radiation pattern or the cooling pattern greater than the width of the wiring patterns by a large margin. The width of the wiring patterns should naturally be determined to be a width that allows a required amount of current to flow, from the point of view of inductance, heat emission and the like, while the width of the heat radiation pattern or the cooling pattern is set in consideration of the waste heat effect, irrespectively of the amount of current carrying capacity. Accordingly, large margin refers to a case where the width of the heat radiation pattern or the cooling pattern is clearly different from the standard width of the wiring patterns which corresponds to the allowed amount of current carrying capacity. In the case where the width of the wiring patterns is set to the above described standard width, for example, large margin refers to the width of the heat radiation pattern or the cooling pattern being greater than the width of the wiring patterns. Of course, it is not necessary for the width to be great throughout the entire portion of the heat radiation pattern or the cooling pattern, but rather, there may be a portion of a small width. The same effects can be gained in the case where the pattern allows heat to be effectively conveyed to a portion which is wider, outside of the area to which the LED is attached. Furthermore, large margin can refer to an average width gained by dividing the integrated pattern area by the integrated pattern distance being greater than that of the wiring patterns. Alternatively, in the case where slits divide the cooling pattern or the heat radiation pattern into a plurality of portions, each of which has a width smaller than that of the wiring patterns, that is to say, in the case where, substantially, one heat radiation pattern or cooling pattern appears to be a pattern with a small width due to slits, the sum of the widths of the respective portions which run generally parallel with slits in between is considered to be the width of the pattern, according to the present invention, in view of the heat radiation effect.

It is desirable in the above attachment structure for the housing to be electrically connected to the lead end of the LED pedestal so as to be voltage clamped, for example, connected to the ground, in order to prevent the potential of the housing from becoming unstable.

In addition, the above described LED and the attachment structure of an LED have significant working effects in the case where they are applied to an ultraviolet LED having a large amount of heat emission. This is because, as described above, ultraviolet LEDs are greatly deteriorated by ultraviolet light, and emit a large amount of heat, and therefore, types that are reliable for a long period of time are limited to the can type. A way to prevent heat accumulation in such a can type without causing short-circuiting or discharge has been widely desired.

As described above, according to the present invention, even in the case where LEDs are placed relatively densely, internal heat accumulation can be effectively prevented, while effectively avoiding short-circuiting, discharge, breaking, fire and the like, and it becomes possible to increase the reliability, durability and safety of the apparatus without fail when this type of LED is utilized.

BRIEF DESCRIPTION OF THE DRAWINGS

FIG. 4(*a*) is a plan view of the LED;

FIG. 4(*b*) is a diagram for illustrating a function of the LED;

DESCRIPTION OF THE PREFERRED EMBODIMENTS

In the following, one embodiment of the present invention is described in reference to the drawings.

Figure 9:
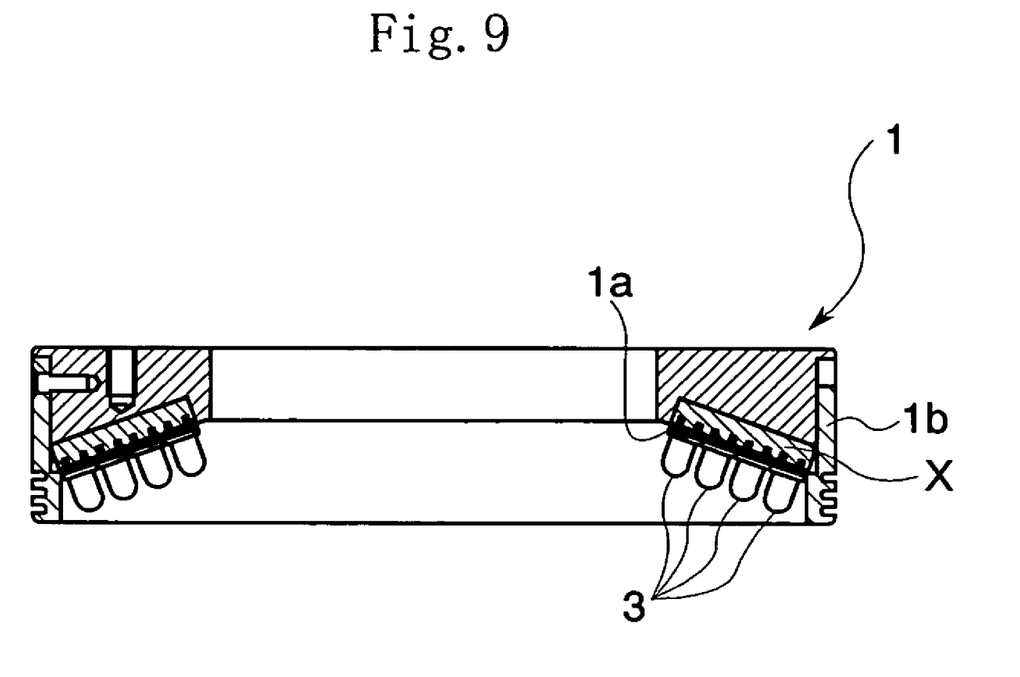
FIG. 9 is a cross-sectional view conceptually showing a ring type illumination device to which LEDs are attached.

The attachment structure of an LED according to this embodiment is applied to the mounting of an LED 3 which has a structure slightly different from that described above on a substrate 100 that forms surface 1*a* for mounting light emitting bodies of illumination device 1 for product inspection using reflected illumination shown in FIG. 12. FIG. 9 shows an illumination device 1 for product inspection using reflected illumination, on which LEDs 3 according to this embodiment are mounted, and which is substantially the same as that shown in FIG. 12, except for that the portion that corresponds to the air layer in FIG. 12 is filled in with a heat radiation member X in FIG. 9. A silicone filling or the like can be cited as an example of this heat radiation member X. In the case where frame 1*b* is made of aluminum, this frame 1*b* maybe formed so as to occupy the portion which approximately corresponds to the air layer, and a heat radiation plate may intervene between frame 1*b* and LEDs 3.

The attachment structure of this embodiment is appropriately used when LEDs 3 are primarily ultraviolet LEDs, referred to as can type as described in the prior art, having a so-called three-pin structure where three pins lead out from housing 31, as shown in FIGS. 1 to 7. That is to say, an LED 3 has an LED pedestal 31*p* that is surrounded by an anode A, a cathode K and a reflector R within housing 31, in a manner where pins (generally referred to as leads) a1 and k1, which are the connection ends of anode A and cathode K, lead to the outside from lead positions which are set in a base 31*b* in disc form that forms housing 31, so that a voltage for light emission from the interface between the PN layers in an LED element 32 placed within housing 31 can be applied between anode A and cathode K via these pins a1 and k1. This light is reflected from reflector R so as to be guided to a transparent portion 31*c*, which either transparent or translucent, provided to housing 31 above base 31*b*, as described above. Reflector R is formed through digging so as to be provided on base 31*b*. Transparent portion 31*c* made of approximately spherical body of resin or glass, has a lens function and is placed so as to seal base 31*b*.

It is preferable to use silicone, a composite resin (anti-UV resin) or the like as the resin.

In addition, in the present embodiment, a lead end leads to the outside of housing 31 as the third pin r1 in the condition where the lead end is thermally connected to the above described LED pedestal 31*p*, while maintaining a condition of insulation between pin a1 of the above described anode A and base 31*b* of housing 31, as well as between pin k1 of the above described cathode K and base 31*b* of housing 31.

Concretely speaking, through holes 31*a* and 31*k*, as well as mounting hole 31*r*, are provided in lead positions set at the bottom of housing 31, and pins a1 and k1 of anode A and cathode K are inserted into corresponding through holes 31*a* and 31*k*, in a condition of isolation, and at the same time, pin r1 which leads out from LED pedestal 31*p* is made to make direct contact with corresponding mounting hole 31*r*, or is made to make indirect contact with mounting hole 31*r* via a heat radiating elastomer (for example, a heat radiating silicone rubber or a heat radiating resin) having a high thermal conductance, so that mounting hole 31*r* is thermally and electrically connected to pedestal 31*p*. Base 31*b* of housing 31 is, of course, made of a material having high electrical and thermal conductivity.

Pin r1 is located in a portion directly beneath LED pedestal 31*p* which is positioned at the center of reflector R, and the lead position of this pin r1 is positioned at the center of base 31*b* in a disc form. The top of transparent portion 31*c* having an approximately spherical surface which covers base 31*b* of housing 31 becomes the center 31*cx* of the spherical surface, and the lead position of the above described pin r1 is located in a portion directly beneath center 31*cx* of this transparent portion 31*c*. In addition, pins a1 and k1 of anode A and cathode K are positioned on both sides of pin r1 which is thermally connected to LED pedestal 31*p*, and these pins a1, k1 and r1 have a positional relationship where they are aligned approximately in a straight line.

Figure 5:
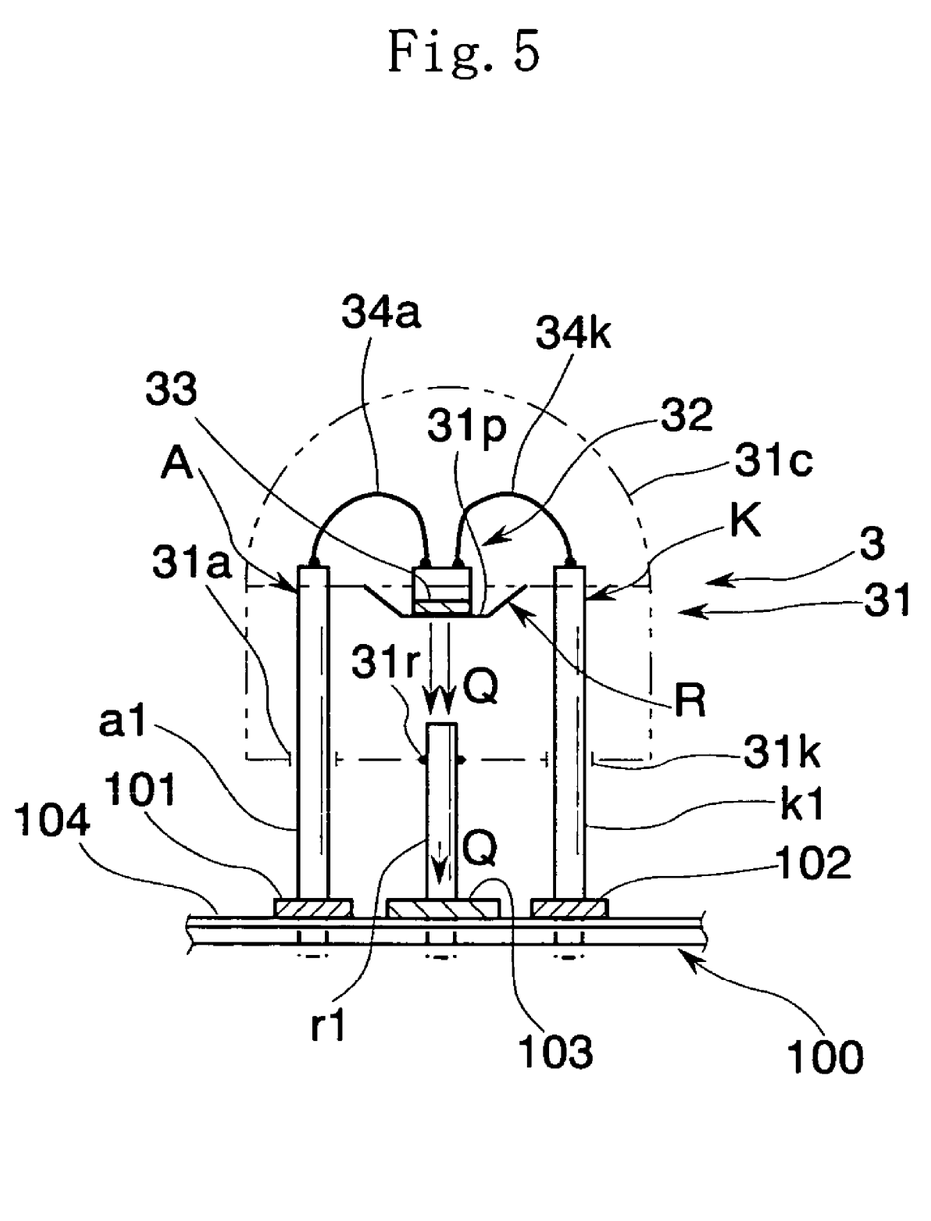
FIG. 5 is a front view of the LED.

Pin r1, together with housing 31, is formed of a material having high electrical and thermal conductivity. Spaces between pins a1 and k1 of anode A and cathode K, and the sides of through holes 31*a* and 31*k* which are provided in respectively corresponding lead positions of housing 31 are filled in with an insulating material z, such as glass or a silicone rubber, in order to maintain a condition of insulation. An insulating layer 33 having a high thermal conductivity, such as an epoxy resin, an imide based resin, alumina or aluminum nitride, intervenes between LED element 32 and LED pedestal 31*p*. In FIG. 5, symbols 34*a* and 34*k* indicate conductor wires (bonding wires).

Figure 1:
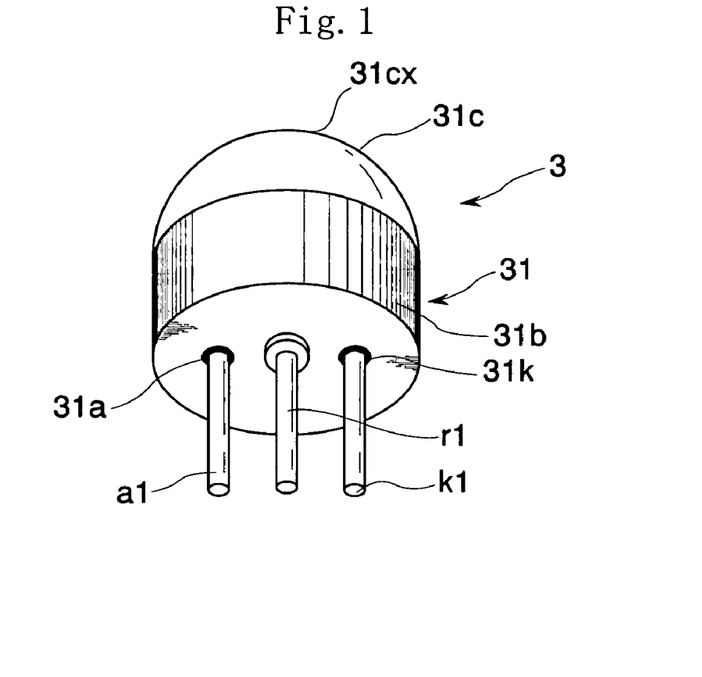
FIG. 1 is a perspective view conceptually showing the appearance of an LED according to one embodiment of the present invention.
Figure 2:
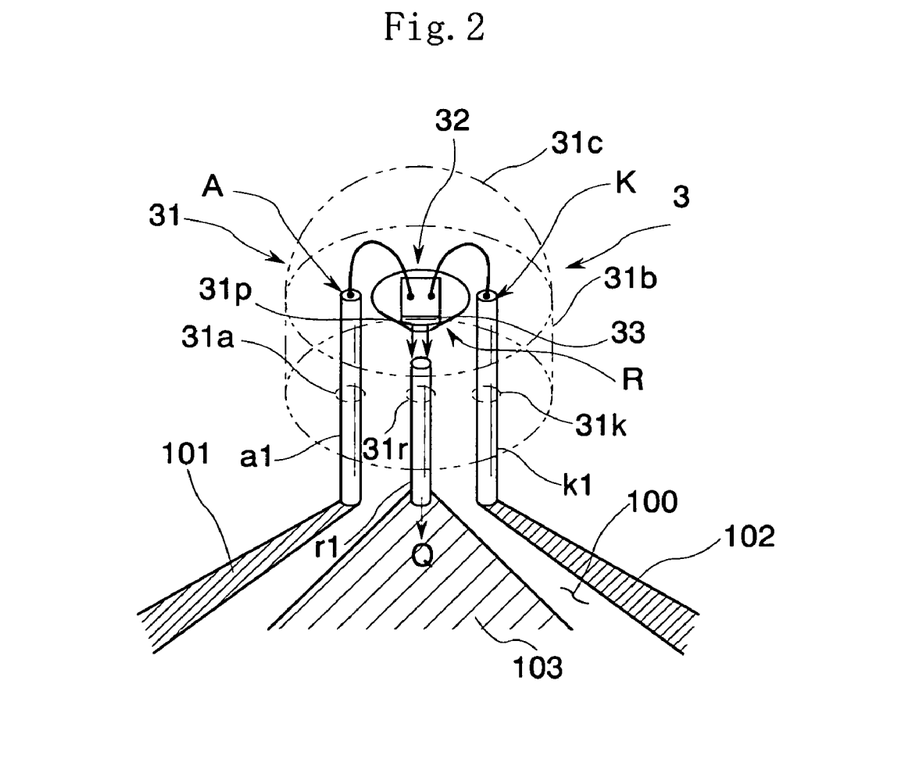
FIG. 2 is a perspective view conceptually showing a heat radiating structure, together with the internal structure of the LED.
Figure 3:
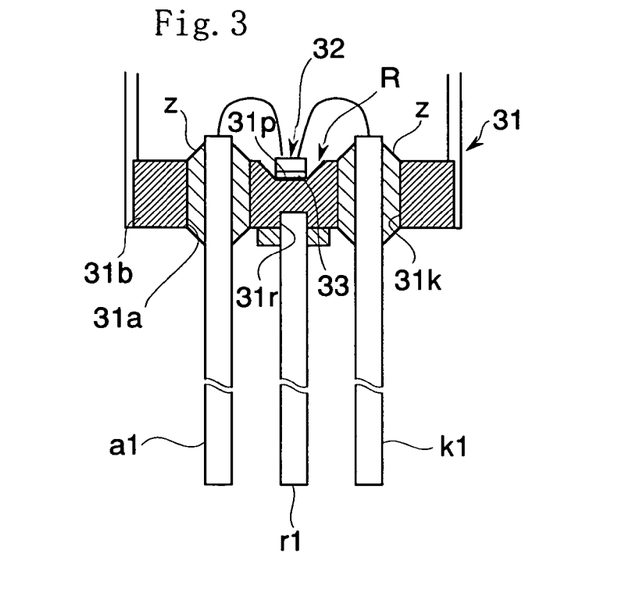
FIG. 3 is a cross-sectional view of a portion of the LED.
Figure 4:
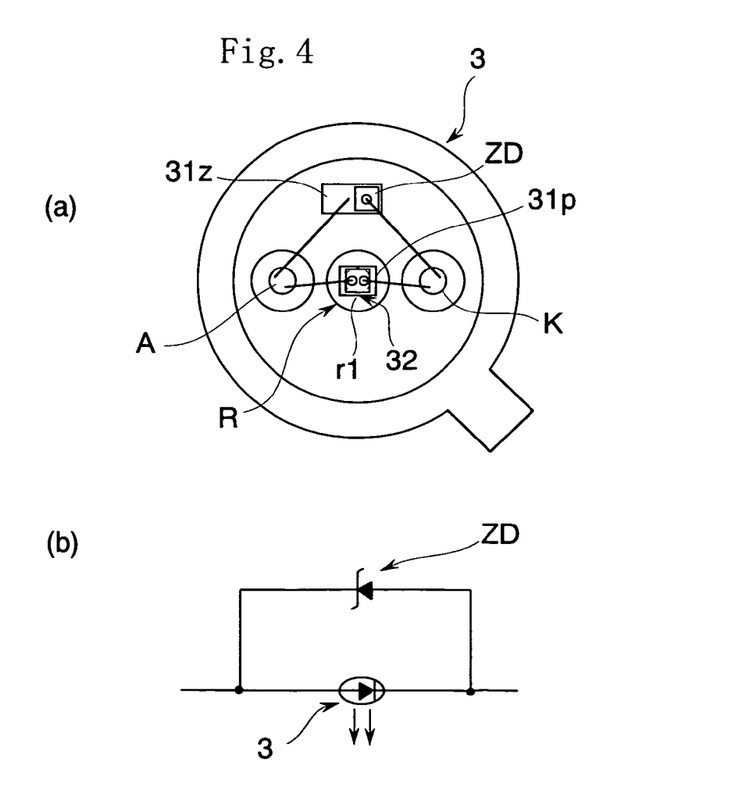

In addition, as shown in FIG. 4(*a*), a Zener diode ZD makes a connection between anode A and cathode K in an antiparallel manner within housing 31. FIG. 4(*b*) shows a circuit diagram thereof, where the LED itself is provided with a defense against static electricity and surge voltage without losing its properties. This Zener diode ZD is placed on Zener diode pedestal 31*z* within housing 31, and an insulating plate of which the surface is processed with a metal is used for this Zener diode pedestal 31*z*.

Figure 10:
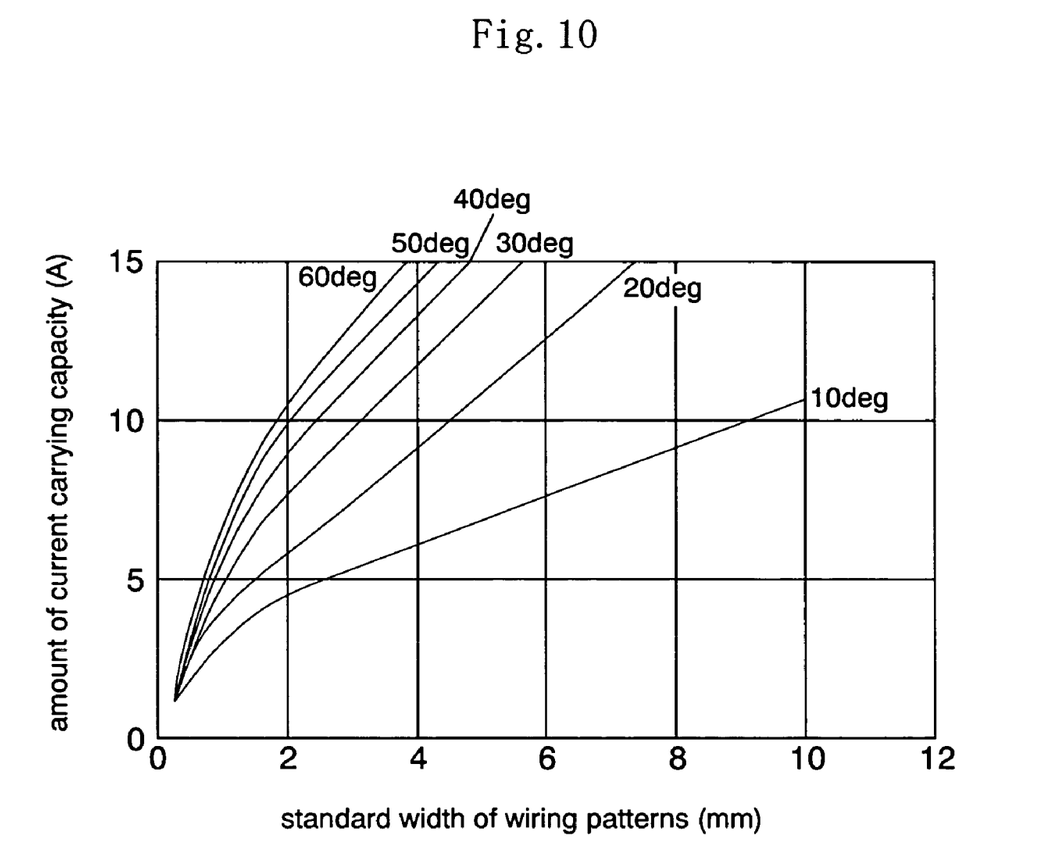
FIG. 10 is a graph showing the relationship between the amount of current carrying capacity and the standard width of wiring patterns.

Meanwhile, patterned substrate 100 of FIG. 5, to which LEDs 3 according to the present embodiment are connected, is utilized as surface for mounting light emitting bodies 1*a* of FIG. 9, and is processed with copper or the like using a mask, so that pairs of wiring patterns 101 and 102 which correspond to the two polarities are formed. In addition to these wiring patterns 101 and 102, a heat radiating pattern 103 on which a masking process of polyimide or the like is carried out is provided independently of (that is to say, without crossing) the above described wiring patterns. The width of this heat radiating pattern 103 has a large margin relative to the width of wiring patterns 101 and 102. The relationship between the width of wiring patterns 101 and 102, and the allowable amount of current carrying capacity is naturally determined in consideration of inductance and heat emission, while the width of heat radiating pattern 103 is set in consideration of the waste heat effect, irrespectively of the amount of current carrying capacity. Accordingly, large margin indicates a case where the width of heat radiating pattern 103 is clearly different from the standard width of wiring patterns 101 and 102 that corresponds to the amount of current carrying capacity. In the case where the allowable amount of current carrying capacity is 1 A, for example, the standard width is 1 mm when the wiring patterns are made of copper and have a thickness of 30 microns, and in the case where the amount of current carrying capacity increases or decreases, the standard width is proportionally increased or decreased. FIG. 10 illustrates alternative relationships between the allowable amount of current carrying capacity and the standard width. This figure is a graph showing the relations between the amount of current carrying capacity and the standard width for a number of temperatures, with the standard width along the lateral axis and the amount of current carrying capacity along the longitudinal axis, in the case where the wiring patterns are made of a copper foil and have a thickness of 105 μm. The width of heat radiating pattern 103 is determined in consideration of the heat radiating effect, without depending on the relationships of this graph, and therefore, becomes a width which is greater than these wiring patterns when a heat radiating area is secured as effectively as possible on the substrate surface. Thus, the difference between these widths becomes a useful margin, in view of easy recognition of heat radiating pattern 103 relative to wiring patterns 101 and 102, and prevention of mistakes in the attachment of an LED. Symbol 104 indicates an insulating coating film, such as an epoxy resin or an imide based resin that covers the surface of the substrate.

In addition, respective pins a1 and k1 of anode A and cathode K are connected to the above described wiring patterns 101 and 102, and pin r1, which is thermally connected to LED pedestal 31p, is connected to heat radiating pattern 103.

As described above, an LED 3 of the present embodiment is provided with pin r1 which is thermally connected to LED pedestal 31p outside of housing 31 while keeping a condition of insulation between pin a1 of anode A and housing 31, as well as between pin k1 of cathode K and housing 31.

Accordingly, an LED 3 having this structure can make heat in LED pedestal 31p, which is a primary heat accumulating portion, be effectively conveyed to the outside of housing 31 via pin r1, as shown by the arrows in FIG. 5. In addition, in the case where pin r1 leads out in such a manner, a configuration for releasing heat to an appropriate portion, such as heat radiating pattern 103, can also be gained, as shown in the figure, and therefore, it becomes possible to secure a sufficient heat radiating area by selecting a portion which is not subjected to a spatial restriction as a heat radiating portion.

In addition, housing 31 is electrically insulated from anode A and cathode K, and therefore, even in the case where illumination device 1 of FIG. 9 is formed by densely placing LEDs 3, it becomes possible to effectively avoid the occurrence of a potential gap, which may cause short-circuiting, and discharge between housings 31 and 31, as well as between housings 31 and pins a1 and k1, of adjacent LEDs 3, effectively protecting LEDs 3, and effectively enhancing the reliability of illumination device 1.

In particular, housing 31 and pin r1 are electrically connected to each other, and therefore, housing 31 can be actively voltage clamped by utilizing pin r1, and the potential of housing 31 can be maintained without fail at a level which is desirable for avoiding a discharge and the like, thus gaining the effects of the present invention. In addition, the lead position of pin r1 is set in a portion directly beneath LED pedestal 31p, which is the portion closest to LED pedestal 31p and has a small thermal resistance, and therefore, the present invention provides a high thermal conduction, in a manner where heat release can be expected to be effectively carried out.

In particular, the lead position of pin r1 is set in a portion which is approximately aligned with center 31cx of transparent portion 31c that is attached to housing 31, together with LED pedestal 31p, and therefore, light emitted from LED 3 can be efficiently guided to transparent portion 31c, avoiding as much as possible the conversion of the emitted light to heat, and at the same time, a release of the generated heat can be expected to be efficiently carried out.

Here, the lead position of pin r1 is aligned in an approximately straight line with the lead positions of respective pins a1 and k1 of anode A and cathode K, and therefore, even in the case where LED 3 is attached to a location that is three-dimensionally curved, as the surface of a cone shown in FIG. 9, this LED 3 can be attached in a manner where the direction of the generatrix of this cone becomes the same as the direction of the alignment of the pins, without being negatively affected by the curve, and it becomes possible to effectively avoid poor condition of attachment caused by the three-pin structure.

In addition, LED element 32 is placed on LED pedestal 31p in a condition of electrical isolation, and therefore, pin r1 can be prevented without fail from being negatively affected by anode A and cathode K via LED pedestal 31p.

Here, in the present embodiment, Zener diode ZD makes connection between anode A and cathode K in an anti-parallel manner within housing 31, providing an effect where LED 3 protects itself from static electricity and surge voltage. This Zener diode ZD is installed within housing 31 on Zener diode pedestal 31z where an insulating plate of which the surface is processed with a metal is used for this Zener diode pedestal 31z, and therefore, the properties of the diode can be appropriately prevented from being changed due to the effects of anode A and cathode K, and thus the above described effects can be gained. Similar effects can, of course, be gained by using a conventional diode instead of the Zener diode.

Meanwhile, taking into consideration that substrate 100 to which anode A and cathode K are connected is conventionally required for the attachment of such an LED 3, and heat radiating pattern 103 is provided to this substrate 100 independently of wiring patterns 101 and 102 so that LED 3 can be connected, in the present embodiment, and therefore, a heat radiating area can be effectively formed in a simple pattern formation process, where substrate 100, which is an existing part, can be effectively utilized without introducing a new member for heat radiation. In addition, a plurality of LEDs 3 are connected to this heat radiating pattern 3, and thereby, uniform heat diffusion can be expected from all of LEDs 3. In particular, heat radiating pattern 103 need not be connected throughout the entirety and may have a disconnection in the middle, as long as an effective heat releasing area can be secured, unlike wiring patterns 101 and 102, and therefore, can be designed much more easily, and can undergo a masking process much more easily, in comparison with wiring patterns 101 and 102.

Furthermore, the width of heat radiating pattern 103 is greater than the width of wiring patterns 101 and 102 by a large margin, and therefore, it becomes possible to secure a sufficient heat radiating area in heat radiating pattern 103 for further effective heat release.

Conventionally, it has been believed that it is difficult to adopt a heat radiating structure in the case where LEDs 3 are densely placed on the surface of a substrate which spreads in three dimensions, as is seen in this illumination device, and therefore, the effects that are gained by applying the present invention are extremely large. In addition, the working effects of the above described LED 3 and the attachment structure thereof are extremely significant in the case where they are used for an ultraviolet LED having a large amount of heat emission or for an attachment structure of ultraviolet LEDs having a large amount of heat emission.

Figure 6:
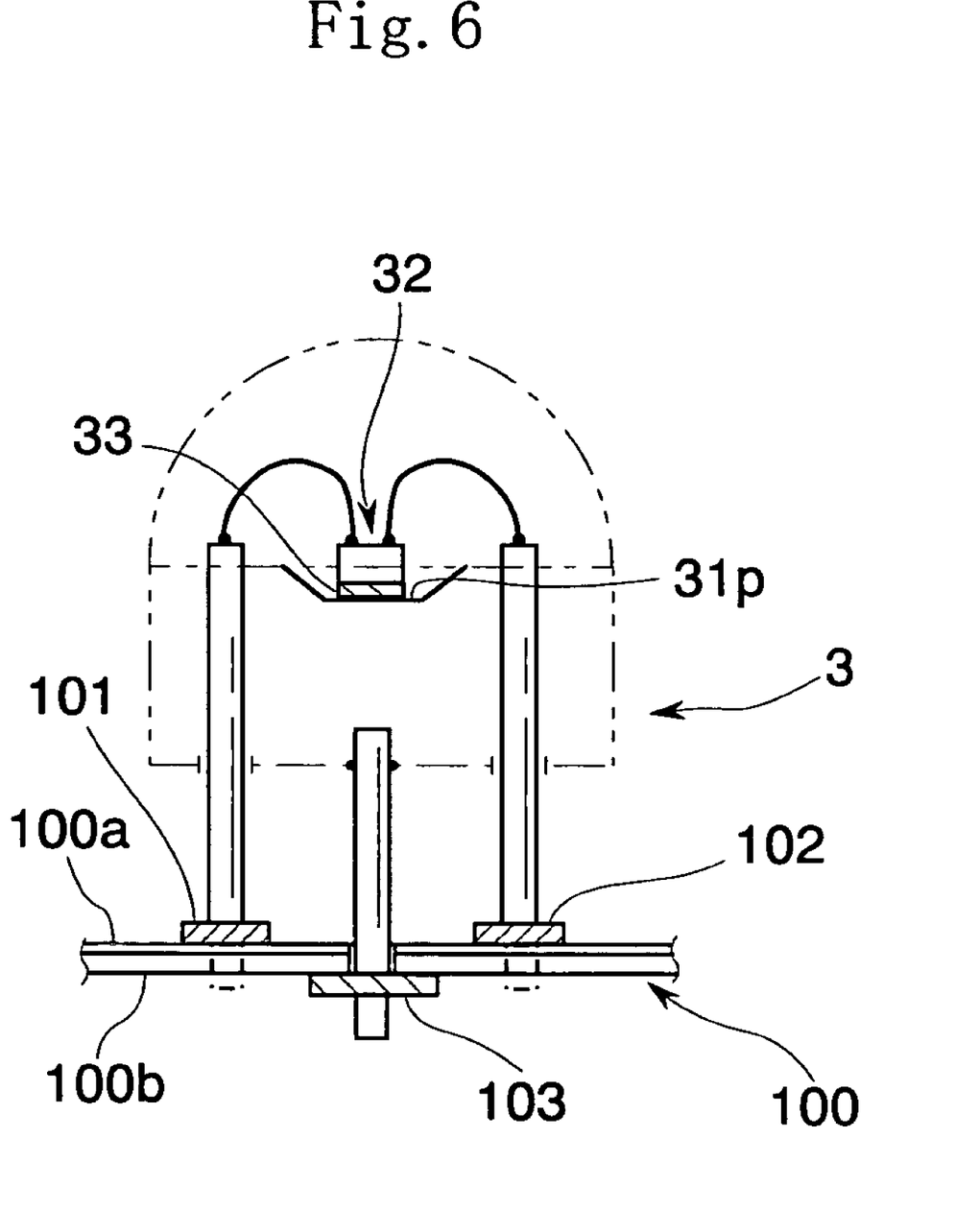
FIG. 6 is a view showing a modification of the present invention.

Here, the concrete configurations of the respective portions are not limited to those in the above described embodiment. At least a portion of the housing, for example, maybe formed of insulating material, together with pin r1, which is the lead end of LED pedestal 31p. In this manner, it becomes possible for the housing to make direct contact with a metal having high heat conducting properties for heat radiation. In addition, as shown in FIG. 6, it is also effective to form heat radiating pattern 103 on rear surface 100b of substrate surface 100a on which wiring patterns 101 and 102 are formed. By doing so, heat radiating pattern 103 is formed on a different surface from wiring patterns 101 and 102, and a sufficient heat radiating area can be secured, making heat radiation effective.

Figure 7:
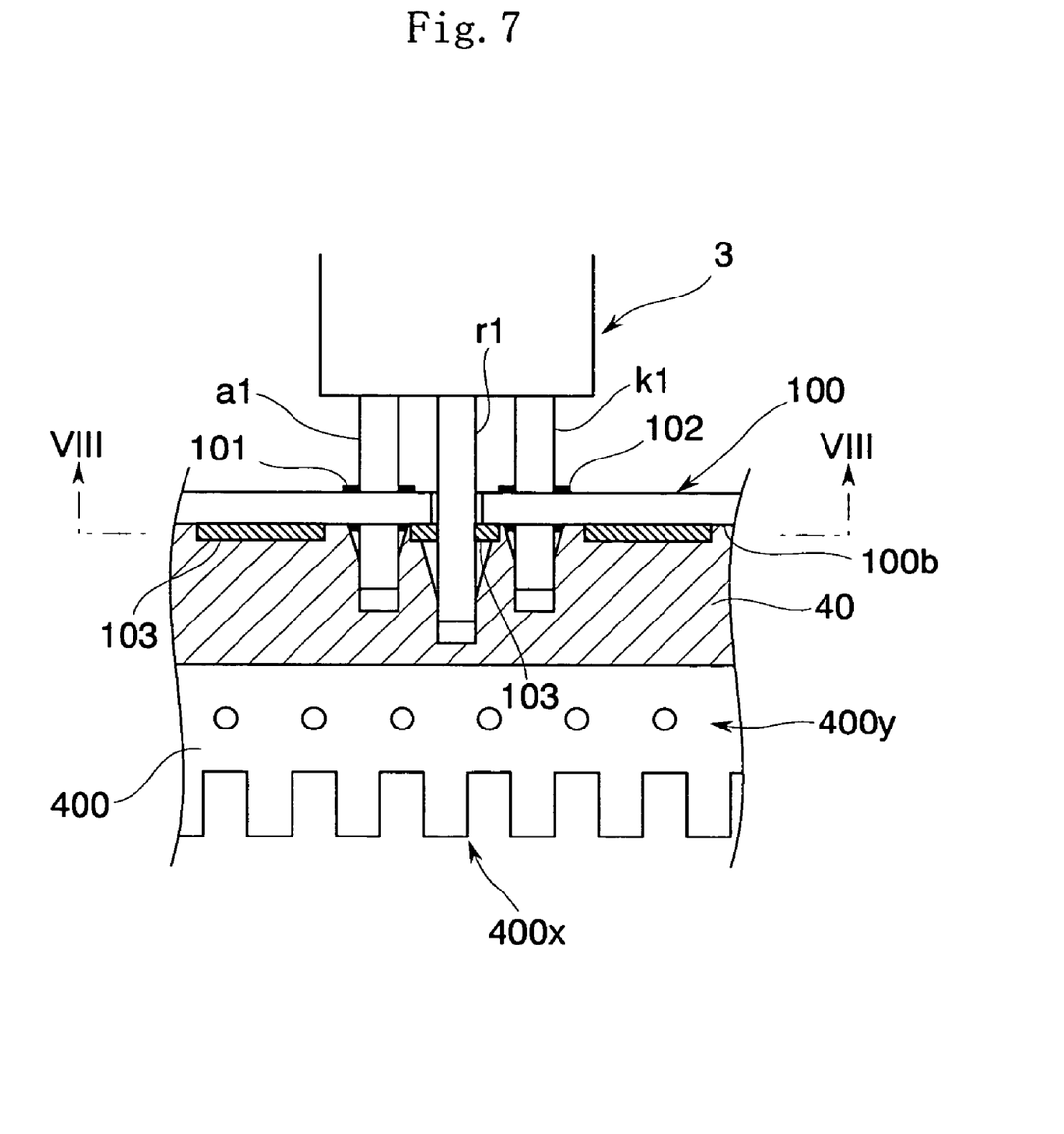
FIG. 7 is a view showing another modification of the present invention.

In addition, as shown in FIG. 7, a heat radiating member 40 may be directly attached to the rear surface of substrate 100 as a heat radiating area, and pin r1 may be connected to this heat radiating member 40. In the case where it is necessary to cover rear surface 100b of substrate 100 with an insulating member, for example, an effective heat radiating structure can be simply implemented by utilizing this insulating member as the above described heat radiating member 40. In the drawings, symbol 103 indicates a heat radiating pattern, and symbols 101 and 102 indicate wiring patterns.

Here, in the example of FIG. 7, heat radiating member 40 is placed on base 400 made of aluminum. Therefore, in the case where this base 400 is used as a heat sink by providing a heat radiating structure 400x, such as fins, to this base 400, it becomes possible to efficiently release heat that has been conducted from heat radiating member 40 to base 400.

It is of course effective to form a cooling structure 400y by providing a water jacket, as shown in the figure, within base 400, in place of or in addition to heat radiating structure 400x. In this case, heat radiating member 40 is provided with a cooling source, and therefore, it corresponds to a cooling member, according to the present invention, rather than to a heat radiating member. A cooling source may, of course, be connected to the above described heat radiating pattern 103 so as to function as the cooling pattern of the present invention.

Alternatively, an effective configuration can be gained by making an electrical connection of pin r1, which is the lead end of LED 3 that has been mounted on the substrate, to heat radiating pattern 103 on the above described substrate, or to a cooling pattern where a cooling source is added to the heat radiating pattern so as to achieve a voltage clamp. Also, the pin r1 as the lead end of the LED 3 may be connected to a heat radiating member or a cooling member through the heat radiating pattern or the cooling pattern.

Furthermore, it is possible to provide a structure where pin r1 penetrates heat radiating member 40 so as to be directly connected to base 400, which is a heat sink, in the case where the voltage clamp is not negatively affected.

Figure 8A:
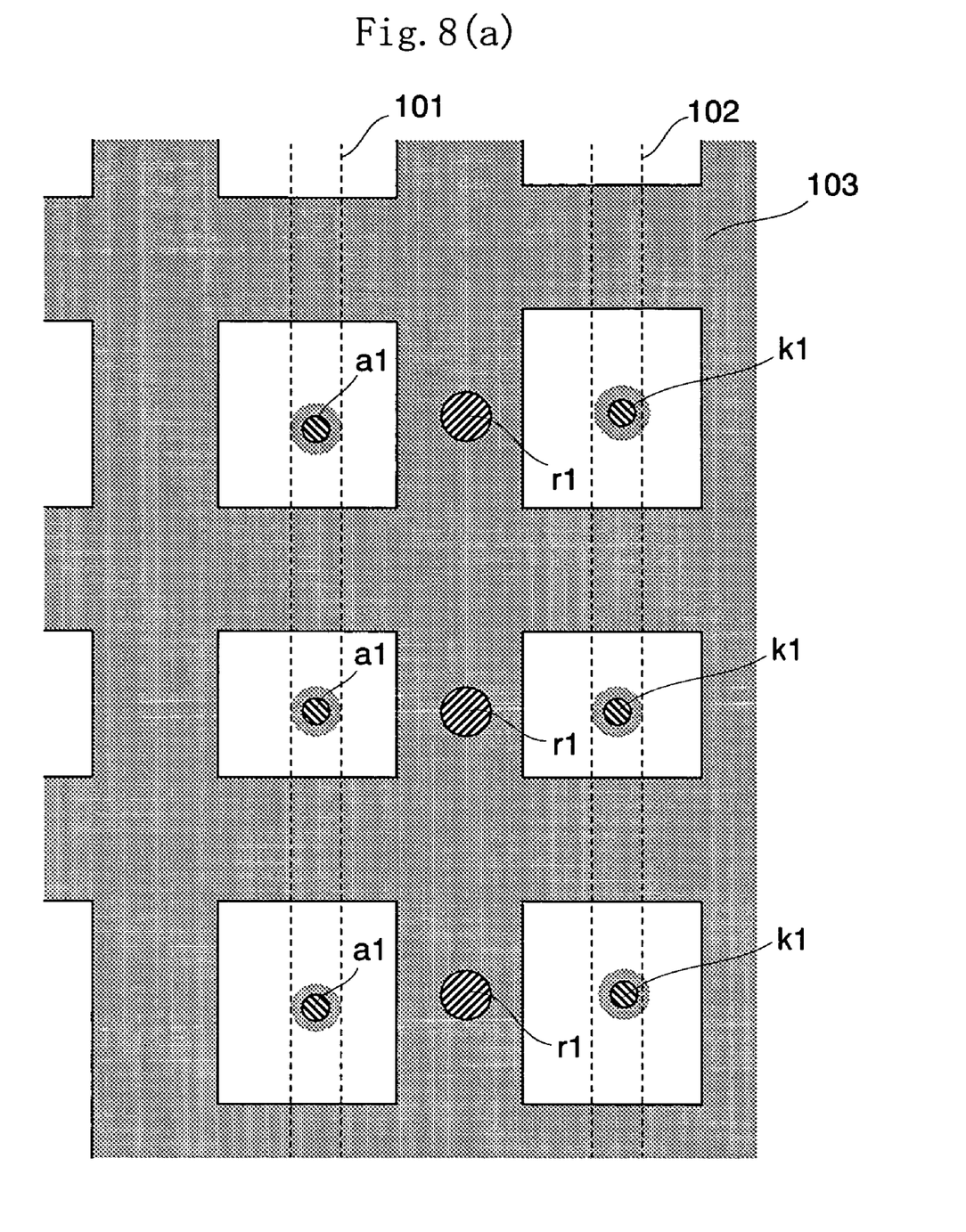
FIG. 8(a) is a cross-sectional view along line VIII-VIII of FIG. 7.

FIG. 8(a) is an enlarged cross-sectional view along line VIII-VIII of FIG. 7 in the case where a number of LEDs 3 are placed longitudinally and laterally without intervening space. As shown in this figure, heat radiating patterns 103, to which pins r1 of respective LEDs 3 are connected, are connected to each other, and these heat radiating patterns 103 are formed avoiding the portions where pins a1 and k1 of at least anodes A and cathodes K of respective LEDs 3 penetrate substrate 100. Accordingly, in the condition where a great number of LEDs 3 are longitudinally and laterally aligned, heat radiating patterns 103 exhibit a grid or an analogous pattern, as shown in the drawing, in a manner where the portions where pins a1 and k1 of anodes A and cathodes K penetrate substrate 100 form islands which are isolated from heat radiating patterns 103, exhibiting a dotted pattern or an analogous pattern when viewed as a whole. Heat radiating patterns 103 secure the heat radiating area by utilizing as large an available area of substrate 100 as possible, and the figure clearly shows that the width of the heat radiating patterns is greater than that of wiring patterns 101 and 102. Of course, the same holds in the case where a cooling pattern is formed.

Figure 8B:
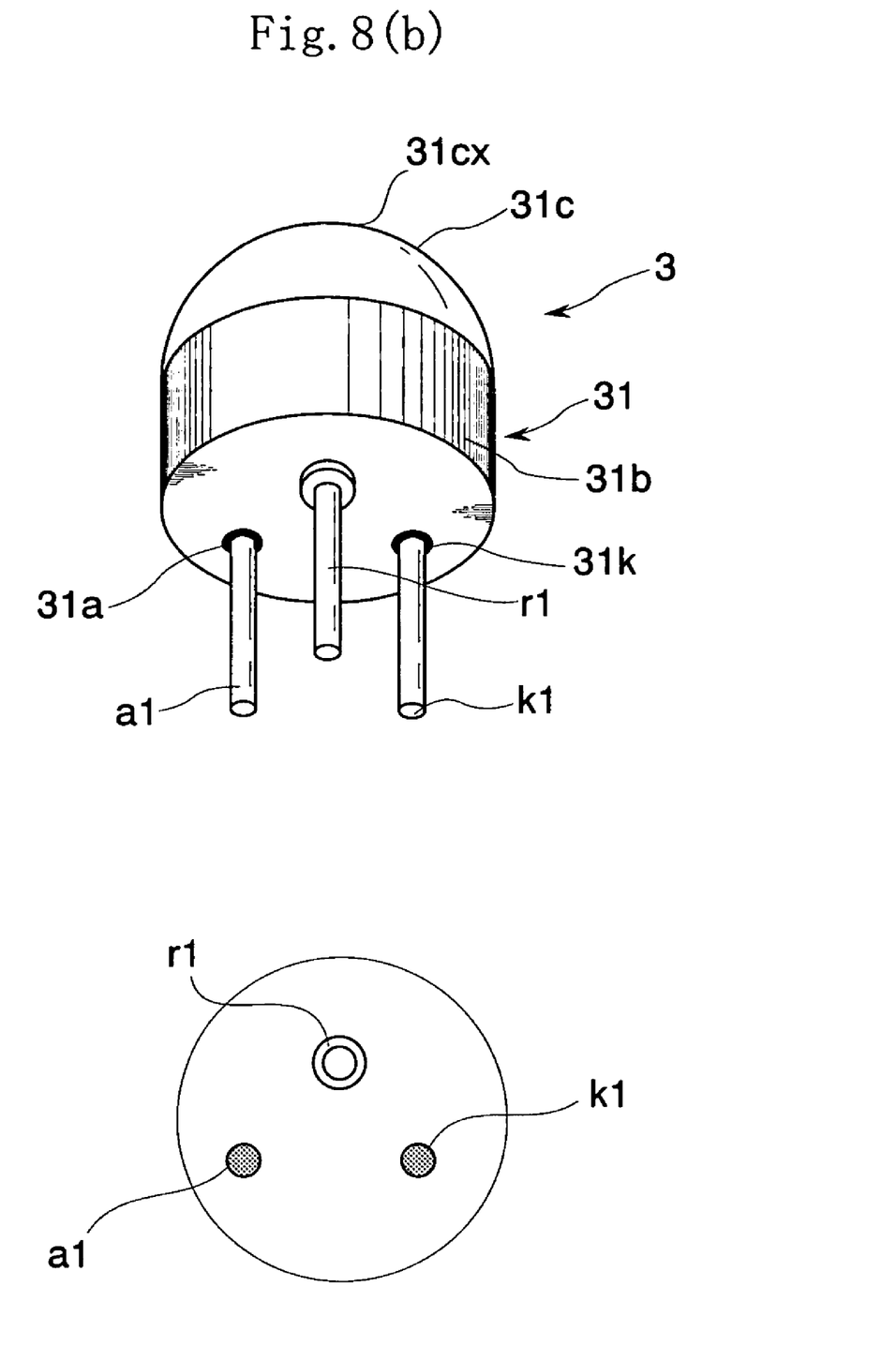
FIG. 8(b) is a view showing a modification other than the above modifications of the present invention.

In addition, though in the above described embodiment, the lead position of a pin r1 is aligned in an approximately straight line with the lead positions of pins a1 and k1 of anode A and cathode K, it is also possible to place pins r1, a1 and k1 in a manner where they form a triangle as viewed in the plane, as shown in FIG. 8(b), in order to enhance the strength of the attachment, as long as the basic working effects of the present invention are gained.

In addition to the above, a variety of modifications are possible in a scope which does not deviate from the gist of the present invention, such that the present invention is applicable to a variety of LED arrays, including a segment.

What is claimed is:

1. An attachment structure of an LED, characterized in that in a connection of an anode and a cathode of an LED where said anode, said cathode and an LED pedestal are provided within a housing to wiring patterns provided on a substrate, a lead end which is thermally connected to said LED pedestal is provided outside of the housing of said LED, and a heat radiating pattern or a cooling pattern is provided independently of the wiring patterns on said substrate and the lead end of said LED is thermally connected to the heat radiating pattern or the cooling pattern; and wherein the lead end of the LED that has been mounted on a substrate is electrically connected to the heat radiating pattern or the cooling pattern of said substrate.

2. The attachment structure of an LED according to claim 1 characterized in that the heat radiating pattern or the cooling pattern is formed on the rear surface of the substrate on which the wiring patterns are formed.

3. The attachment structure of an LED according to claim 1, wherein the width of the heat radiating pattern or the cooling pattern is greater than the width of the wiring pattern.

4. The attachment structure of an LED according to claim 1, characterized in that the LED is used for emitting ultraviolet light.

5. An attachment structure of an LED, characterized in that in a connection of an anode and a cathode of an LED where said anode, said cathode and an LED pedestal are provided within a housing to wiring patterns provided on a substrate, a lead end which is thermally connected to said LED pedestal is provided outside of the housing of said LED, and a heat radiating member or a cooling member is directly attached to the rear surface of said substrate in a manner that the lead end of said LED is thermally connected either directly to the heat radiating member or the cooling member or indirectly to the heat radiating member or the cooling member via a heat radiating pattern or a cooling pattern which is provided independently of the wiring patterns of said substrate.

6. The attachment structure of an LED according to claim 5, wherein the width of the heat radiating pattern or the cooling pattern is greater than the width of the wiring pattern.

7. The attachment structure of an LED according to claim 5, characterized in that the LED is used for emitting ultraviolet light.

* * * * *